(12) United States Patent
Song et al.

(10) Patent No.: US 12,307,490 B2
(45) Date of Patent: *May 20, 2025

(54) IMAGE/TEXT-BASED DESIGN CREATING DEVICE AND METHOD

(71) Applicants: Woo Sang Song, Seoul (KR); Jianri Li, Seoul (KR); Ki-Young Shin, Seoul (KR)

(72) Inventors: Woo Sang Song, Seoul (KR); Jianri Li, Seoul (KR); Ki-Young Shin, Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/593,491

(22) Filed: Mar. 1, 2024

(65) Prior Publication Data

US 2024/0202786 A1 Jun. 20, 2024

Related U.S. Application Data

(63) Continuation of application No. 16/991,311, filed on Aug. 12, 2020, now Pat. No. 11,948,177, which is a (Continued)

(30) Foreign Application Priority Data

Feb. 12, 2018 (KR) .................. 10-2018-0017229

(51) Int. Cl.
*G06F 30/27* (2020.01)
*G06F 18/21* (2023.01)
(Continued)

(52) U.S. Cl.
CPC .............. *G06Q 30/06* (2013.01); *G06F 18/21* (2023.01); *G06F 30/27* (2020.01); *G06F 40/205* (2020.01); *G06N 3/045* (2023.01)

(58) Field of Classification Search
CPC ....... G06Q 30/06; G06F 40/205; G06F 30/27; G06F 18/21; G06N 3/045
See application file for complete search history.

(56) References Cited

U.S. PATENT DOCUMENTS 10,438,264 B1 10/2019 Viswanathan
2005/0261953 A1 11/2005 Malek et al.
(Continued)

FOREIGN PATENT DOCUMENTS

AU 2015271906 B2 3/2017
EP 3389002 A4 10/2018
(Continued)

OTHER PUBLICATIONS

"European Search Report issued in corresponding EP Application 19751770.9", completed Feb. 8, 2021, Feb. 8, 2021, 27 pages.
(Continued)

*Primary Examiner* — Kibrom K Gebresilassie
(74) *Attorney, Agent, or Firm* — Guntin & Gust, PLC; Miyoung Shin

(57) ABSTRACT

Provided is a design creating device including: a parsing unit for parsing image data and text data in real time online; a learning unit for training a design generation model by using artificial intelligence on the basis of the parsed image data and text data; and a design generation unit for generating a new design or a design element of a specific item by using the generation model trained in the learning unit based on the real time parsed image and text data, without separate input from a user.

5 Claims, 16 Drawing Sheets

Related U.S. Application Data continuation of application No. PCT/KR2019/001645, filed on Feb. 11, 2019.

(51) Int. Cl.
*G06F 40/205* (2020.01)
*G06N 3/045* (2023.01)
*G06Q 30/06* (2023.01)

(56) References Cited

U.S. PATENT DOCUMENTS

| | | | |
|---|---|---|---|
| 2009/0138113 A1 | 5/2009 | Hoguet | |
| 2009/0144173 A1* | 6/2009 | Mo | G06N 3/006 700/98 |
| 2016/0292148 A1* | 10/2016 | Aley | G06F 40/274 |
| 2018/0293603 A1* | 10/2018 | Glazier | G06Q 10/107 |
| 2018/0374136 A1* | 12/2018 | Kanii | G06Q 30/0621 |
| 2020/0372193 A1* | 11/2020 | Song | G06F 18/21 |

FOREIGN PATENT DOCUMENTS

| | | |
|---|---|---|
| JP | 2000285151 A | 10/2000 |
| JP | 2008500660 A | 1/2008 |
| JP | 2008287684 A | 11/2008 |
| KR | 100511210 B1 | 8/2005 |
| KR | 20140056085 A | 5/2014 |
| KR | 20140070917 A | 6/2014 |
| KR | 101501405 B1 | 3/2015 |
| KR | 101611895 B1 | 4/2016 |
| WO | 2017098760 A1 | 6/2017 |

OTHER PUBLICATIONS

"International Search Report for International Application PCT/KR2019/001645", May 24, 2019.
"Japanese Office Action for Counterpart Japanese Application No. 2020-565249", Apr. 25, 2023, 5 pages.
Lassner, et al., "A Generative Model of People in Clothing, IEEE International Conference on Computer Vision", 2017, pp. 853-862.
Shih, et al., "Compatibility Family Learning for Item Recommendation and Generation", Cornell University Library, Ithaca, New York; arXiv: 1712.01262, Dec. 2, 2017, 10 pages.

* cited by examiner

ITEM EXTRACTION

SUNGLASSES

HOT PANTS

T-SHIRTS

FLIP-FLOP

IMAGE/TEXT-BASED DESIGN CREATING DEVICE AND METHOD

CROSS-REFERENCE TO RELATED APPLICATION(S)

This application is a continuation of Ser. No. 16/991,311 filed on Aug. 12, 2020, which is a continuation of PCT/KR2019/001645 filed on Feb. 11, 2019, which claims the benefit of Korean Patent Application No. 10-2018-0017229, filed on Feb. 12, 2018, in the Korean Intellectual Property Office, the disclosures of which are incorporated herein in their entirety by reference.

FIELD OF THE DISCLOSURE

The present disclosure relates to an image and text-based fashion design extraction and design generation apparatus and method.

BACKGROUND

The pace of change in design trends is very fast. In particular, as a global spa brand is created, and social media became more active, the pace of change in fashion became faster, and trendy items tend to converge to the same design worldwide.

Accordingly, in order to keep pace with the rapid change of fashion and supply according to global design, designers needed repetitive data collection and fast design assistance, and fashion MDs needed to collect and analyze separate latest trends and emerging brand information. In addition, designers must research the rapidly changing fashion trends and design accordingly. However, in an urgent case, three designs must be made within seven days, and in fact, 200-300 pieces of drawing were required to complete a new design.

Also, in the case of Fashion MD, It was inefficient due to the high cost and effort to update fashion trends and generate new designs, such as exploring collections and making order lists and lookbooks in major fashion cities such as New York/Paris.

SUMMARY

According to an embodiment of the present disclosure, the present disclosure provides a design generation device including: a parsing unit configured to parse image data and text data; a learning unit configured to train a design generation model using artificial intelligence based on parsed image data and text data; and a design generation unit configured to generate a new design or a design element of a specific item by using the design generation model learned in the learning unit.

According to another embodiment of the present disclosure, the present disclosure provides a design generating method including: learning a design generation model using artificial intelligence based on parsed image data and text data; and generating a new design or a new design element of a specific item using the learned design generation model.

According to another embodiment of the present disclosure, the present disclosure provides a program stored in a storage medium capable of generating a new design based on images and text, wherein the program executes: learning a design generation model using artificial intelligence based on parsed image data and text data; and generating a new design or a new design element of a specific item using the learned design generation model.

According to various embodiments of the present disclosure, a new design may be generated by a time/costly more efficient means according to the rapidly changing design trend.

DETAILED DESCRIPTION

Figure 1:
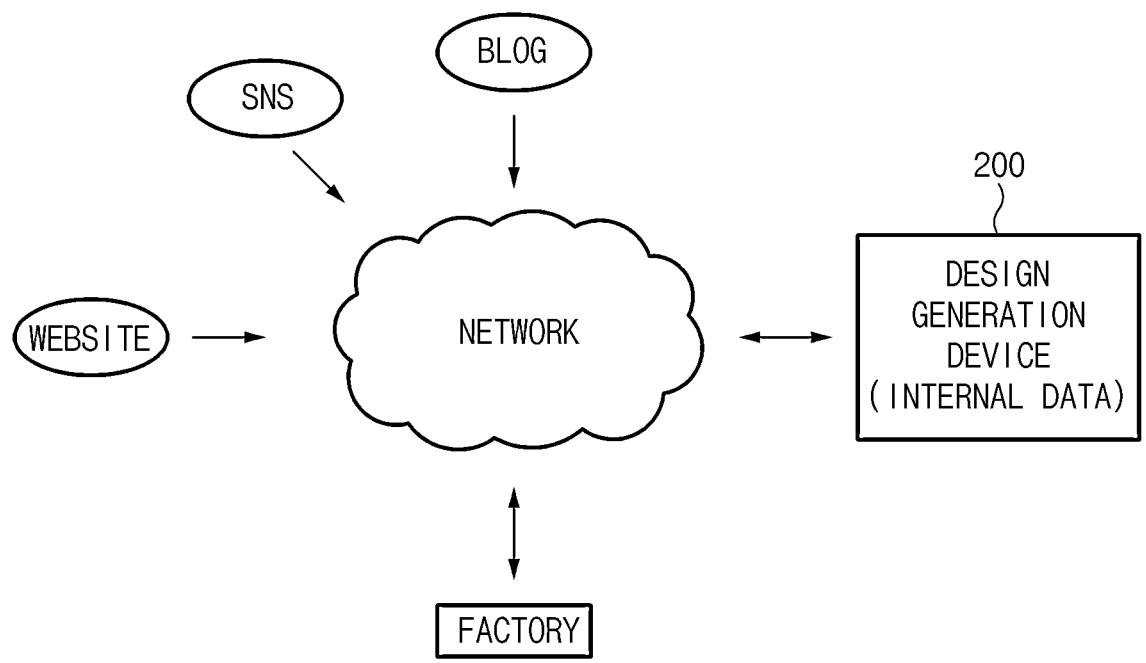
FIG. 1 is an overall configuration diagram according to an embodiment of the present disclosure.

Hereinafter, the present disclosure will be described in detail with reference to the drawings. At this time, the same components in each drawing are denoted by the same reference numerals as possible. In addition, detailed descriptions of already known functions and/or configurations are omitted. The contents disclosed below focus on parts necessary for understanding the operation according to various embodiments, and descriptions of elements that may obscure the subject matter of the description will be omitted.

For instance, the expression "A or B", or "at least one of A or/and B" may indicate include A, B, or both A and B. For instance, the expression "A or B", or "at least one of A or/and B" may indicate (1) at least one A, (2) at least one B, or (3) both at least one A and at least one B.

The terms such as "1st", "2nd", "first", "second", and the like used herein may refer to modifying various different elements of various embodiments of the present disclosure, but do not limit the elements. For example, a first component may be referred to as a second component and vice versa without departing from the scope of the present disclosure.

Also, some components of the drawings may be exaggerated, omitted, or schematically illustrated. The size of each component does not entirely reflect the actual size, and thus the contents described herein are not limited by the relative size or spacing of the components in each drawing.

FIG. 1 is an overall configuration diagram according to an embodiment of the present disclosure.

The design generation device 200 parses images exposed in real time on the Internet, such as a website, social media, blog, and text data related to the image. The image may include any image that can be extracted on the Internet. Specifically, for example, the image may include images that include all fashion-related items, images that contain all items related to accessories, game content-related images (all images that required by the game, such as game background, people, clothes, items, buildings, maps), movie content-related images (movie backgrounds, people, special effects, buildings, maps, etc.), brand logo images, interior-related images (furniture images, furniture arrangements, wallpaper, fabrics, etc.), and various tableware images. In addition, the image includes all visually identifiable images such as landscape photographs and pictures. In addition, the image may include animal images such as birds and puppies.

In addition, when the design generation device 200 parses an image on a website such as a shopping mall, it can also parse sales volume and sales amount data corresponding to the image. In addition, the text related to the image may be, for example, text such as 't-shirt', 'T' or 'top' described in the category or product name of the image when selling a T-shirt in a shopping mall. In addition, text data may include information on product specifications of a corresponding product, such as a material and a texture. In addition, in the product name included in the text data, accessories such as 'earring' and 'necklace', interior terms such as 'wallpaper', 'fabric material', and 'fabric', and furniture terms may be included.

In addition, text data may include content design terms. Content may include games, movies, and cartoons. In addition, the text data may include all terms related to the image to be parsed.

In addition, the design generation device 200 may parse and receive image data uploaded to a social media for a certain period in real time, such as Instagram or Facebook. It is possible to know the latest trends through images uploaded to social media such as Instagram or Facebook. In addition, it is possible to parse image data and text data stored in the design generation device 200 itself.

The design generation device 200 that parses an image exposed in real time on the Internet, such as a website, social media, or blog, or in the design generation device 200 and text data related to the image generates a new design or design element for a particular item based on the parsed image and text. Here, the design element may include at least one of all elements that can constitute a design such as a pattern, shape, and color. The design element may be, for example, an element constituting clothes, shoes, and the like, and the design element may be, for example, an element constituting an interior-related item (all items related to furniture and wallpaper interior). Further, the design element may be an element constituting game content (game background, people, clothes, items, buildings, maps, etc.). Further, the design element may be an element constituting movie content (movie background, character, special effects, buildings, maps, etc.). Further, the design element may be an element constituting a brand logo or the like. In addition, design elements may constitute all elements that can be generated as photographic images. For example, design elements that can constitute landscape images, animal images, and human images are examples.

Specifically, the design generation device 200 extracts an item using parsed image and text data. In order to extract items, in addition to the parsed image and text data, an item extraction model (objection detection) is used. For example, items may include various items such as shoes, bags, dresses, ties, shirts, hats, cardigans, coats, and the like, and items may include all accessories, all interior-related items, movie content components, game content components, and brand logos.

For example, if there is a vector value corresponding to a shoe in the image, a shoe item may be extracted by recognizing the 'shoes' portion of the image.

In addition, text data related to the parsed image may also be used to extract items within the image. Also, a plurality of items may be extracted from one image. For example, if a man stands wearing a beanie, a peacoat in a turtleneck sweater, and jeans and sneakers in a single image, items extracted from the image may be 'beanie', 'turtleneck sweater', 'peacoat', 'jeans' and 'sneakers'.

Figure 3:
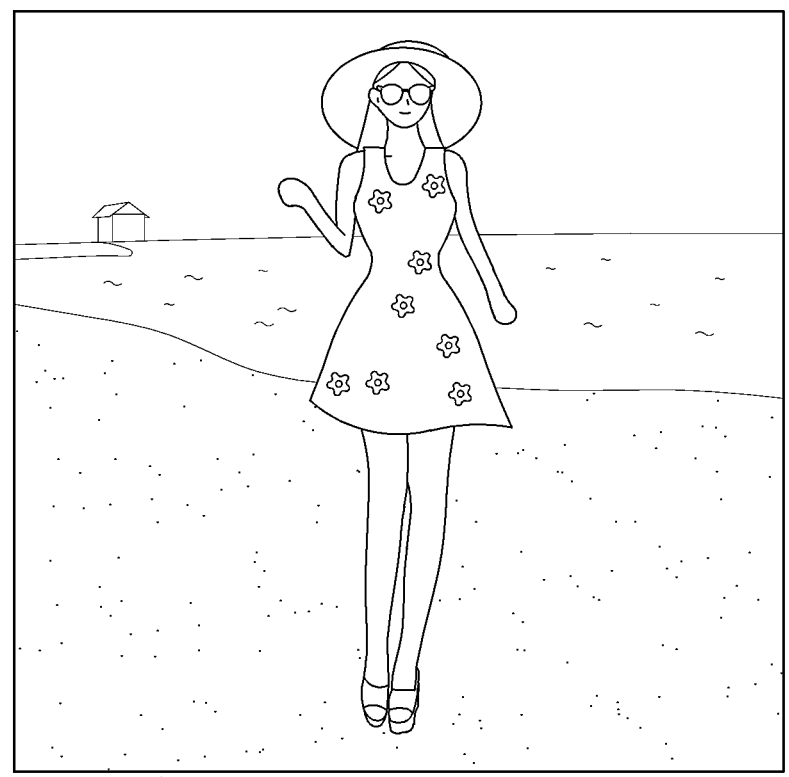
FIG. 3 is a view schematically showing a design generation process of a design generation device according to an embodiment of the present disclosure.
Figure 3:
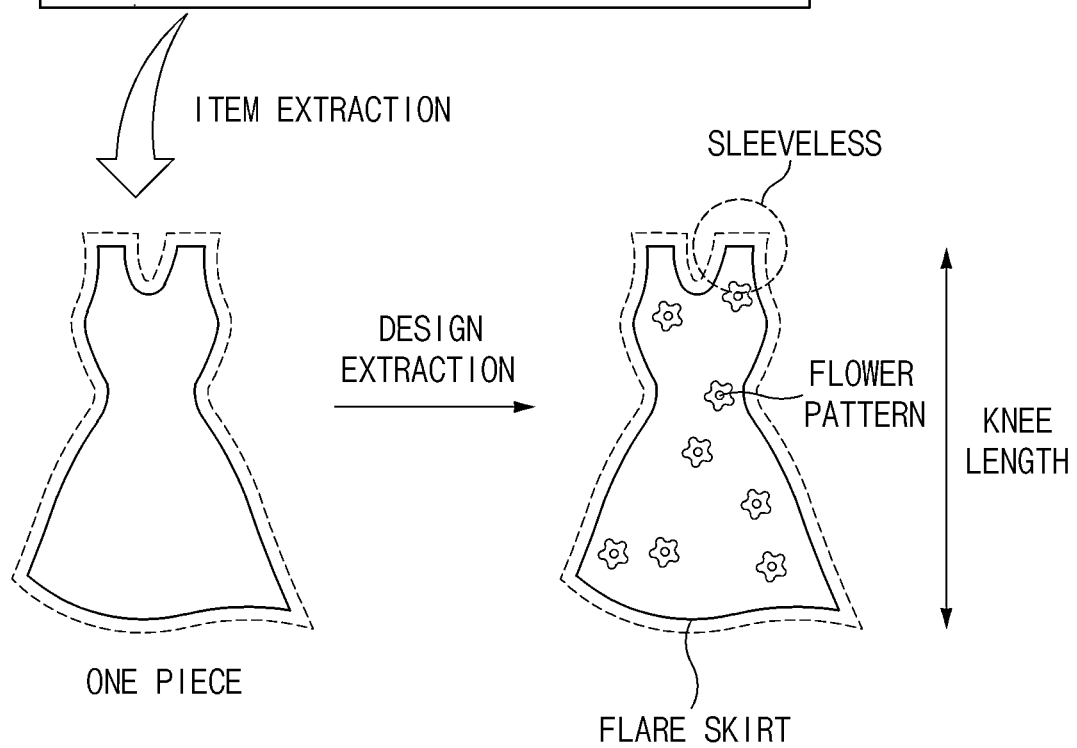

In addition, the design generation device 200 extracts elements of the design for each extracted item. Design elements may be elements included in all images as described above, and will be described in more detail below based on clothes. Elements of the design include all the external elements that constitute the item, such as color, sleeve length, fit, pattern, and print. For example, referring to FIG. 3, a design element of a white flare dress with sleeveless with floral prints in its entirety and a knee-length includes elements such as a flower-shaped print, sleeveless, white, knee-length, and flare dress. Also, the design generation device 200 may extract design elements, for example, patterns, colors, shapes, and the like by using elements such as overall mood, shape, and color in the image from which the item is not extracted from the collected images in addition to the elements of the design for each item.

The design generation device 200 may extract a high-level design or design element from the extracted design or design element. Specifically, the high-level design or design element can be determined based on the case where the frequency of exposure of a specific design or design element on an image exposed to social media or website is more than the reference value. In addition, it is possible to determine the high-level design or design elements based on the sales volume and sales amount of items containing a specific design or design element on a specific website. Also, it is possible to determine the high-level design or design elements based on preferences (determined based on all data that can estimate the preference for the image, such as the number of clicks, number of feedbacks, and number of shares) for the corresponding images exposed on the Internet, such as a specific website or social media. Also, design element of above a certain reference value can be extracted in consideration of exposure frequency, sales volume, and preference for the design element itself. For example, referring to FIG. 3, if the design elements in the extracted designs are "white", "sleeveless", "floral", and "flare dress", each element may be a high-level design element. Also, when determining whether a specific design or design element is a high-level design or design element, it is determined whether it is a design or a design element included in items worn by famous person such as celebrities, and these designs or design elements can be determined by weighting more. Also, for example, if the high-level design is furniture, design elements can include any elements that form furniture, such as "wood", "leather", "with or without armrests". As such, the high-level design may be any design (game content, movie content, brand logo, etc.) that may be included in the image, and in this case, the same high-level design extraction process can be applied.

The design generation device 200 extracts the high-level design or elements of the design and stores it in the storage unit. The design generation device 200 extracts and updates the elements of the high-level design in real time according to the rapid change of the design, and stores and categorizes the high-level design elements for each number of items. Also, if there are no items (such as a general image), only design elements may be stored.

Also, the design generation device 200 may generate and train a design generation model by reflecting image data and text data parsed using artificial intelligence, design elements/design elements for a specific extracted item, and a high-level design element among design elements for a specific item extracted from the design extraction unit. In addition, the design generation device 200 trains the design generation model by considering the generated design or design element for a specific item, and also evaluates the generated design or design element for a particular item to train the design generation unit by further considering the results. Evaluation of the design or design elements will be described later.

Subsequently, the design generation device 200 generates a new design (high-level design or design element) using a design generation model that is learned in real time in the learning unit.

In order to generate a new design, generative adversarial networks (GAN) with category-specific and random generation, Variational Autoencoder (VAE)+GAN that can randomly transform a specific design and generate a new design in a form with high similarity in characteristics of a specific design, genetic algorithm+GAN that recognizes a specific design element as a human genetic trait (looks like), generates various crosses, and repeatedly transfers new, more productive variants between generations based on feedback, conditional GAN for design change, and a style transfer technology that transforms style while maintaining the appearance of an existing design by extracting inspiration for a new design from various images and data can be used.

Machine learning is divided into three categories, and the first is Supervised Learning, the second is Reinforcement learning, and the last is Unsupervised Learning.

Here, GAN belongs to unsupervised learning, and the generator G for generating images and the discriminator D for evaluating the image generated by the generator are opposed to each other to improve the performance of each other, thereby generating a new image. Specifically, D tries to determine only the original data as true, and G generates fake data so that D cannot be determined as false, and the performance of the two models is improved together, so that finally D cannot distinguish between real data and fake data.

Figure 5:
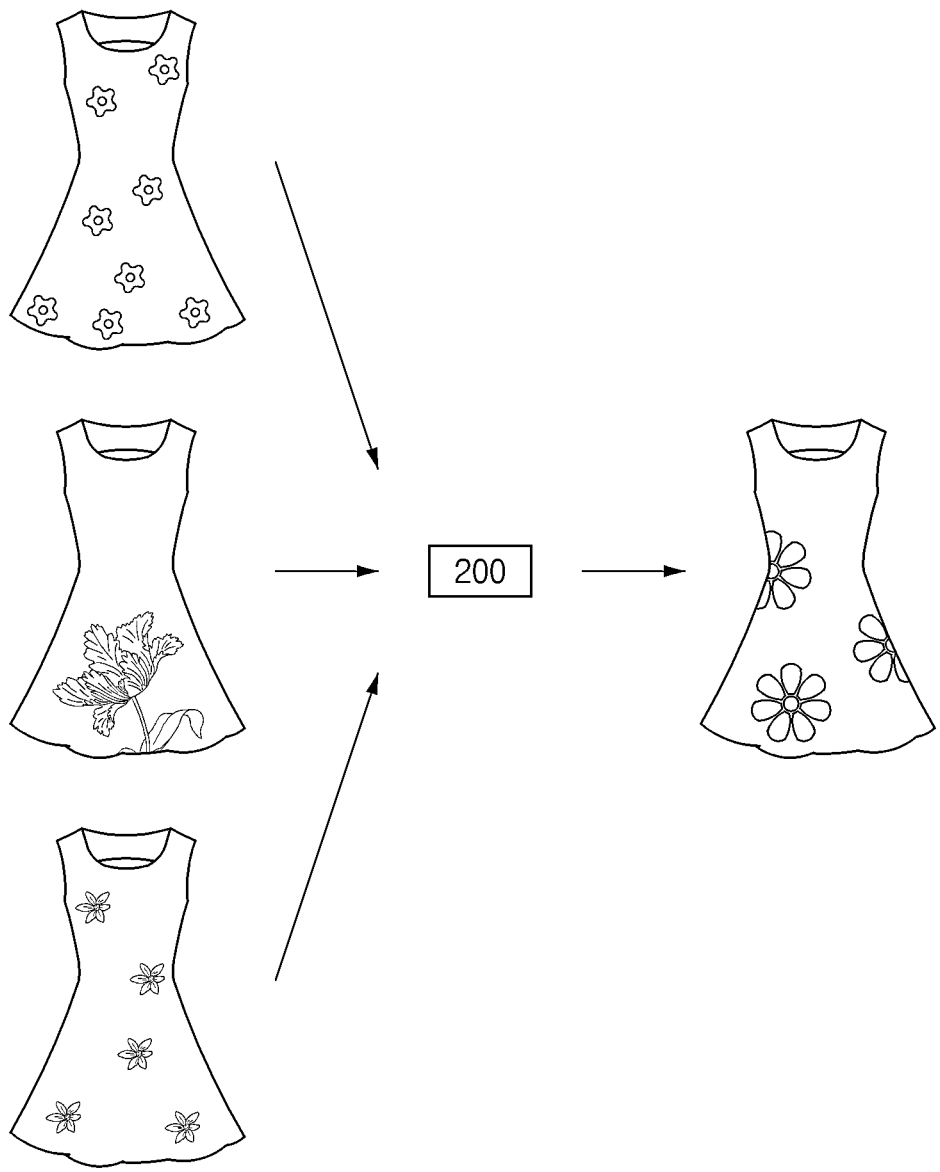
FIG. 5 is a view schematically showing a design generation process by changing a vector value of a trendy design element according to an embodiment of the present disclosure.

As an embodiment of generating a design, there is a method of generating a new design element by changing a vector value of the design element. The change of the vector value can be input as a set value, and can be made by a learned design generation model. Specifically, for example, referring to FIG. 5, if a floral dress is fashionable, the vector values of the existing floral patterns in the floral dress extracted from the collected image can be changed to generate a new floral dress design.

Also, as another embodiment of generating a new design element, there is a method of synthesizing different elements among design elements to generate a new design for a specific item. Specifically, a new design can be generated by merging different elements among elements of each trendy design. For example, referring to FIG. 2E, among the design elements, a knit "puff sleeve", a shirt "ultra violet", and a "long dress" are synthesized, so that designs with ultraviolet index long dresses with puff sleeves can be generated. In addition, it may be automatically and randomly merged for these different elements, or may be merged according to the inputted set values (for design elements to be merged). Different design elements are applicable even when the items are different. For example, a pattern of clothes may be applied to furniture, and the shape of an accessory may be applied to items of a game.

In addition, as another embodiment of generating a new design element, there is a method of generating a new design element by randomly changing and synthesizing the design elements.

Figure 7:
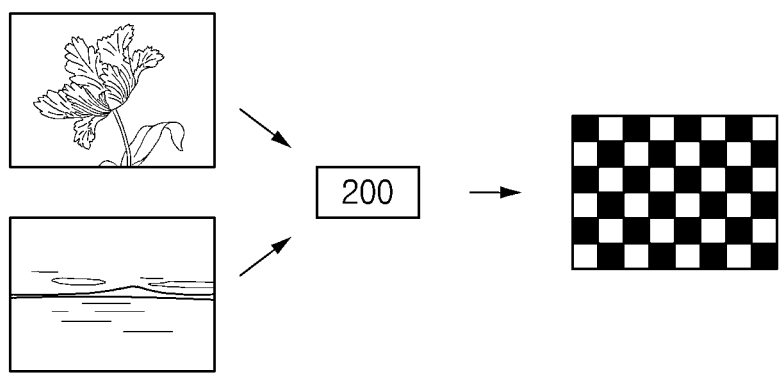
FIG. 7 is a view schematically showing a new design generation process by randomly changing and synthesizing design elements according to an embodiment of the present disclosure.

For example, referring to FIG. 7, a pattern for a flower is extracted from a flower photo, and a sunset color and mood are extracted from a photo with a sunset, such that a sunset pattern with a flower pattern may be generated.

In addition, the generated design or design element is reflected when the design generation model is trained again, so that the design generation model can be trained. And the newly learned design generation unit can be used again when generating a new design or design element.

Subsequently, the design generation device 200 evaluates the generated new designs or design elements according to certain criteria. At this time, the design generation device 200 may rank new designs or design elements extracted in consideration of various factors. Ranking new designs or design elements may be determined based on the frequency of exposure of a specific design or design element on images exposed to social media or websites in general, the volume and amount of sales of items that contain a specific design or design element, and the preference (determined based on all data that can estimate the preference for the image, such as clicks, feedback, and sharing) for the corresponding image exposed on the Internet, such as a specific website or social media. In addition, when determining the frequency of exposure or when ranking, weights can be given to designs or design elements exposed from celebrities or famous person's social media or images, and if the preference, sales volume, or sales amount for a design or design element sold by a specific brand or website among the same designs or elements of a design is higher, weights can be given to the design or elements of the design (hereinafter, "weight determination"). The design generation device 200 ranks the new designs or new design elements generated in such a way.

Also, in such a way, the design generation model can be trained using information ranked in a new design or a new design element.

Figure 2:
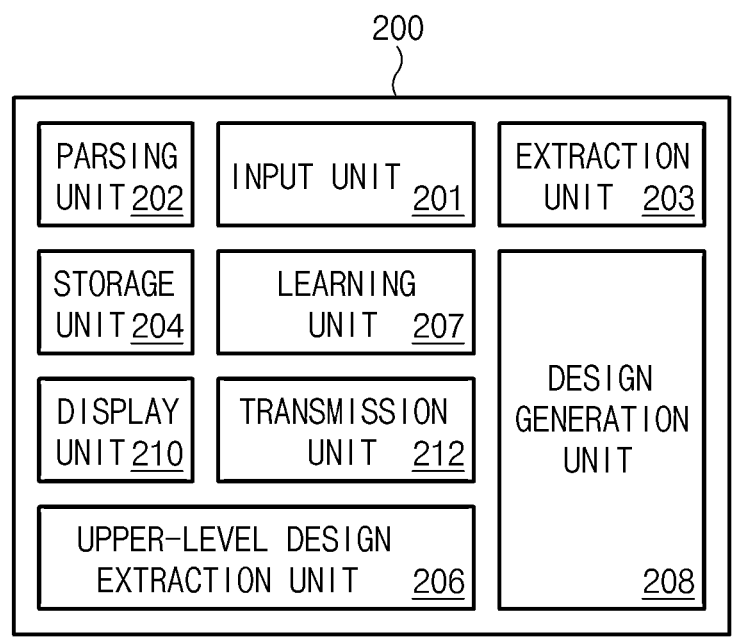
FIG. 2 is a block diagram of a design generation device according to an embodiment of the present disclosure.

FIG. 2 is a block diagram of a design generation device 200 according to an embodiment of the present disclosure.

The design generation device 200 includes an input unit 201, a parsing unit 202, an extraction unit 203, a storage unit 204, a high-level design extraction unit 206, a learning unit 207, and a design generation unit 208, a display unit 210, and a transmission unit 212.

The text or label may be received through the input unit 201 and reflected in the change of the vector value.

The parsing unit 202 parses an image and text data related to the image in real time from an external website, blog, or social media server, or from the storage unit 204 through a network. In addition, the sales volume data and sales amount data related to a specific image are parsed from a specific website server or the design generation device itself. In addition, the text related to the image may be, for example, text such as 't-shirt', 'T' or 'top' described in the category or product name of the image when selling a T-shirt in a shopping mall.

The extraction unit 203 extracts items using parsed image and text data. In order to extract items, in addition to the parsed image and text data, an item extraction model (objection detection) is used. For example, items can include various items such as shoes, bags, dresses, ties, shirts, hats, cardigans, coats, and the like, and if there is a vector value corresponding to the shoe in the image, the shoe item can be extracted by recognizing the 'shoes' portion of the image.

Figure 4:
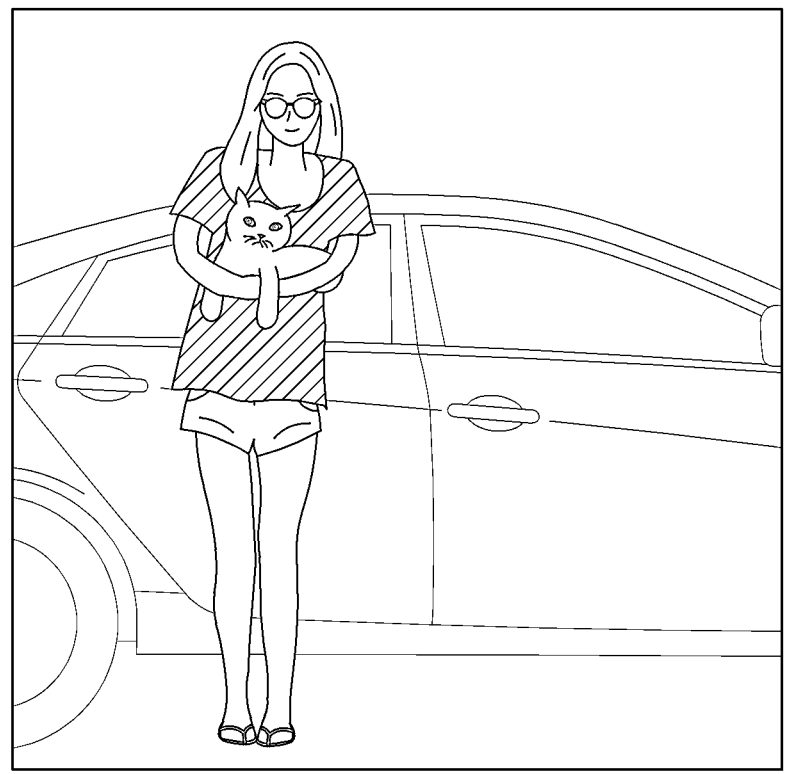
FIG. 4 is a view schematically showing an item extracting process of an image according to an embodiment of the present disclosure.
Figure 4:
Figure 4:
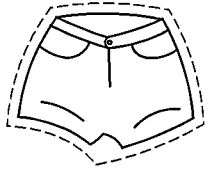
Figure 4:
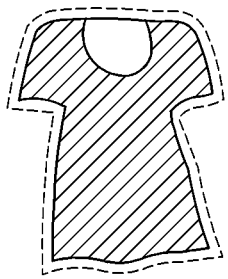
Figure 4:
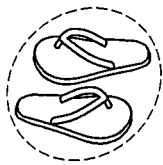

In addition, the extraction unit 203 extracts elements of the design for each extracted item. Elements of the design include all the external elements that constitute the item, such as color, sleeve length, fit, pattern, and print. Further, the extraction unit 203 may extract a plurality of items from one image. For example, referring to FIG. 4, if there is a woman with a cat in her image, wearing sunglasses, wearing a hot pants and a black T-shirt, and wearing flip-flop, the items extracted are sunglasses, hot pants, t-shirts, and flip-flop. Here, cats are not extracted as items.

In addition, the extraction unit 203 extracts elements of the design for each extracted item. Elements of the design include all the external elements that constitute the item, such as color, sleeve length, fit, pattern, print, material, and the like. For example, referring to FIG. 3, a design element of a white flare dress with sleeveless with floral prints in its entirety and a knee-length includes elements such as a flower-shaped print, sleeveless, white, knee-length, and flare dress.

Also, the extraction unit 203 may extract design elements, for example, patterns, colors, shapes, and the like by using elements such as overall mood, shape, and color in the image from which the item is not extracted from the collected images in addition to the elements of the design for each item.

The storage unit 204 stores an item extraction model. The item extraction model may determine which item corresponds to a vector value in the corresponding image. Also, the storage unit 204 categorizes and stores the extracted item. Also, the storage unit 204 categorizes and stores the high-level design for each item extracted by the high-level design extraction unit 206.

The high-level design extraction unit 206 determines which of the extracted designs is a high-level design or design element. Specifically, the upper-level design or design element can be determined based on the case where the frequency of exposure of a specific design on an image exposed to social media or website is more than the reference value. In addition, it is possible to determine the upper-level design or design elements based on the sales volume and sales amount of items containing a specific design or design element on a specific website. Also, it is possible to determine the upper-level design or design elements based on preferences (determined based on all data that can estimate the preference for the image, such as the number of clicks, number of feedbacks, and number of shares) for the corresponding images exposed on the Internet, such as a specific website or social media. For example, referring to FIG. 3, if the design elements in the extracted designs are "white", "sleeveless", "floral" and "flare dress", each element may be an upper-level design element. In addition, when determining whether a high-level design or design element is worn by a famous person such as a celebrity, the design or design element can be determined by giving a predetermined weight.

Also, the learning unit 207 may generate and train a design generation model by reflecting image data and text data parsed using artificial intelligence, design elements/design elements for a specific extracted item, and a high-level design element among design elements for a specific item extracted from the design extraction unit. In addition, the learning unit 207 trains the design generation model by considering the generated design or design element for a specific item, and also evaluates the generated design or design element for a particular item to train the design generation unit by further considering the results.

The design generation unit 208 generates a new design using a design generation model that is learned in real time in the learning unit. In order to generate a new design in the design generation unit 208, generative adversarial networks (GAN) with category-specific and random generation, VAE+GAN capable of random modification of specific designs, genetic algorithm+GAN, conditional GAN for design change, and style transfer technology can be used.

Specifically, the design generation unit 208 uses the following exemplary method to generate a new design or design element.

As an embodiment of generating a design, there is a method of generating a new design element by changing a vector value of the trendy design element. The change of the vector value can be inputted as a set value, and can be made automatically by the learned design generation model. Specifically, for example, referring to FIG. 5, if a floral dress is fashionable, the vector values of the existing floral patterns in the floral dress extracted from the collected image can be changed to generate a new floral dress design.

Also, as another embodiment of generating a new design element, there is a method of synthesizing different elements among design elements to generate a new design for a specific item. Specifically, a new design can be generated by merging different elements among elements of each trendy design. For example, referring to FIG. 6, among the trendy design elements, a knit "puff sleeve", a shirt "ultra violet", and a "long dress" are synthesized, so that designs with ultra-violet color long dresses with puff sleeves can be generated. In addition, it may be automatically and randomly merged for these different elements, or may be merged according to the inputted set values (for design elements to be merged).

In addition, as another embodiment of generating a new design element, there is a method of generating a new design element using a design generation model based on the design elements.

For example, referring to FIG. 7, a pattern for a flower is extracted from a flower photo, and a sunset color and mood are extracted from a photo with a sunset, such that a new pattern may be generated.

In addition, the generated design or design element is reflected when the design generation model is trained again, so that the design generation model can be trained. And the newly learned design generation model can be used again when generating a new design or design element. In addition, such a learned design generation model may include individual models according to types of input values and output values.

Subsequently, the design generation unit 208 evaluates the generated new designs or design elements according to certain criteria. Specifically, the design generation unit 208 ranks new designs or design elements extracted in consideration of various factors.

Ranking new designs or design elements may be determined based on the frequency of exposure of a specific design or design element on images exposed to social media or websites in general, the volume and amount of sales of items that contain a specific design or design element, and the preference (all data that can estimate the preference for the image, such as clicks, feedback, and sharing) for the corresponding image exposed on the Internet, such as a specific website or social media. In addition, when determining the frequency of exposure or when ranking, weights can be given to designs or design elements exposed from celebrities or famous person's social media or images, and if the preference, sales volume, or sales amount for a design or design element sold by a specific brand or website among elements of a high-level design is higher, weights can be given to the elements of the corresponding design (hereinafter, "weight determination"). The design generation device 200 may rank the new design or design element generated in such a way. Also, in such a way, the design generation model can be trained using information ranked in a new design or a new design element.

The display unit 210 may display the design generated by the design generation unit 208.

When manufacturing is to be performed on the generated design, the transmission unit 212 may transmit the design and manufacturing quantity to be manufactured to the factory.

Figure 8:
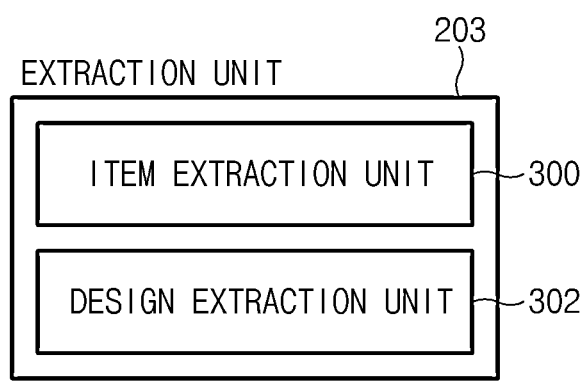
FIG. 8 is a block diagram of an extraction unit according to an embodiment of the present disclosure.

FIG. 8 is a block diagram of an extraction unit 203 according to an embodiment of the present disclosure.

The extraction unit 203 includes an item extraction unit 300 and a design extraction unit 302.

The item extraction unit 300 extracts an item using the received image and text data. In order to extract items, in addition to the received image and text data, a stored item extraction model is used. Here, items can include various items such as shoes, bags, dresses, ties, shirts, hats, cardigans, coats, and the like, and if there is a vector value corresponding to the shoe in the image, the shoe item can be extracted by recognizing the 'shoes' portion of the image. In addition, text related to the image may be used as a reference for extracting an item from the received image. Further, the item extraction unit 300 may extract a plurality of items from one image. For example, referring to FIG. 4, if there is a woman with a cat in her image, wearing sunglasses, wearing a hot pants and a black T-shirt, and wearing flip-flop, the items extracted are sunglasses, hot pants, t-shirts, and flip-flop. Here, cats are not extracted as items.

The design extraction unit 302 extracts the design and design elements of the extracted item. Also, the design extraction unit 302 may extract design elements through parsed images and text. Design element includes all the external elements that constitute the item, such as color, sleeve length, fit, pattern, and print. In addition, the design elements may include colors, moods, materials, patterns, and the like in the general image even if the design elements do not constitute the items.

Figure 9:
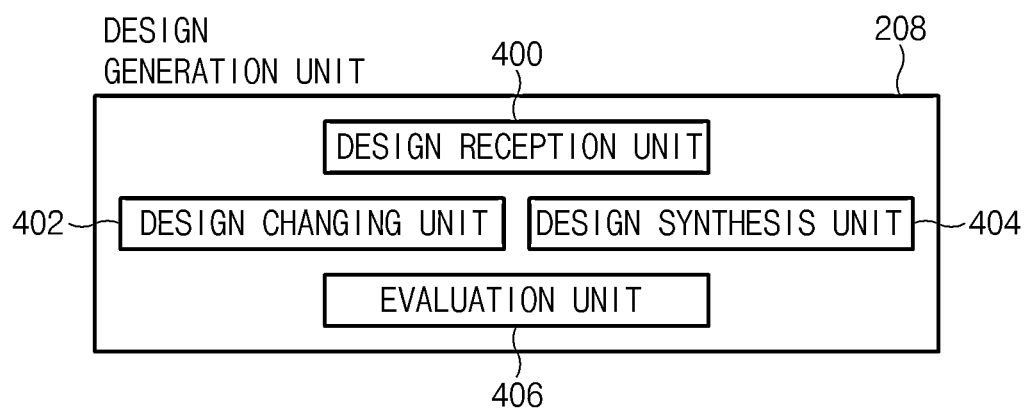
FIG. 9 is a block diagram of a design generation unit according to an embodiment of the present disclosure.

FIG. 9 is a block diagram of a design generation unit 208 according to an embodiment of the present disclosure.

The design generation unit 208 includes a design reception unit 400, a design changing unit 402, a design synthesis unit 404, and an evaluation unit 406.

The design generation unit 208 generates a new design using a design generation model that is learned in real time in the learning unit.

In order to generate a new design, generative adversarial networks (GAN) with category-specific and random generation, VAE+GAN capable of random modification of specific designs, genetic algorithm+GAN, conditional GAN for design change, and style transfer technology can be used.

Machine learning is divided into three categories, and the first is Supervised Learning, the second is Reinforcement learning, and the last is Unsupervised Learning.

Here, GAN belongs to unsupervised learning, and the generator G for generating images and the discriminator D for evaluating the image generated by the generator are opposed to each other to improve the performance of each other, thereby generating a new image. Specifically, D tries to determine only the original data as true, and G generates fake data so that D cannot be determined as false, and the performance of the two models is improved together, so that finally D cannot distinguish between real data and fake data.

In addition, cGAN is different from the existing GAN in that it can generate what it wants rather than randomly generating it.

The design reception unit 400 receives all elements in order to generate a new design. For example, a design generation model and design elements may be received.

The design changing unit 402 generates a new design by changing the vector value of the design element using the extracted design element for each item. Specifically, if there is a floral shirt, it is possible to generate a new floral shirt design by changing the vector values of floral patterns in the floral shirt extracted from the collected image. In addition, the design changing unit 402 may generate a new design element by changing vector values for elements of a design extracted from an item and elements of a design extracted from an image without an item using the design generation model. The vector value can be changed automatically or by receiving a set value.

Using the design elements extracted from the collected items, the design synthesis unit 404 synthesizes different elements among the fashionable design elements for each collected item to generate a new design of the corresponding item. In addition, design changing units and design synthesis units can be mixed to generate new designs.

Figure 6:
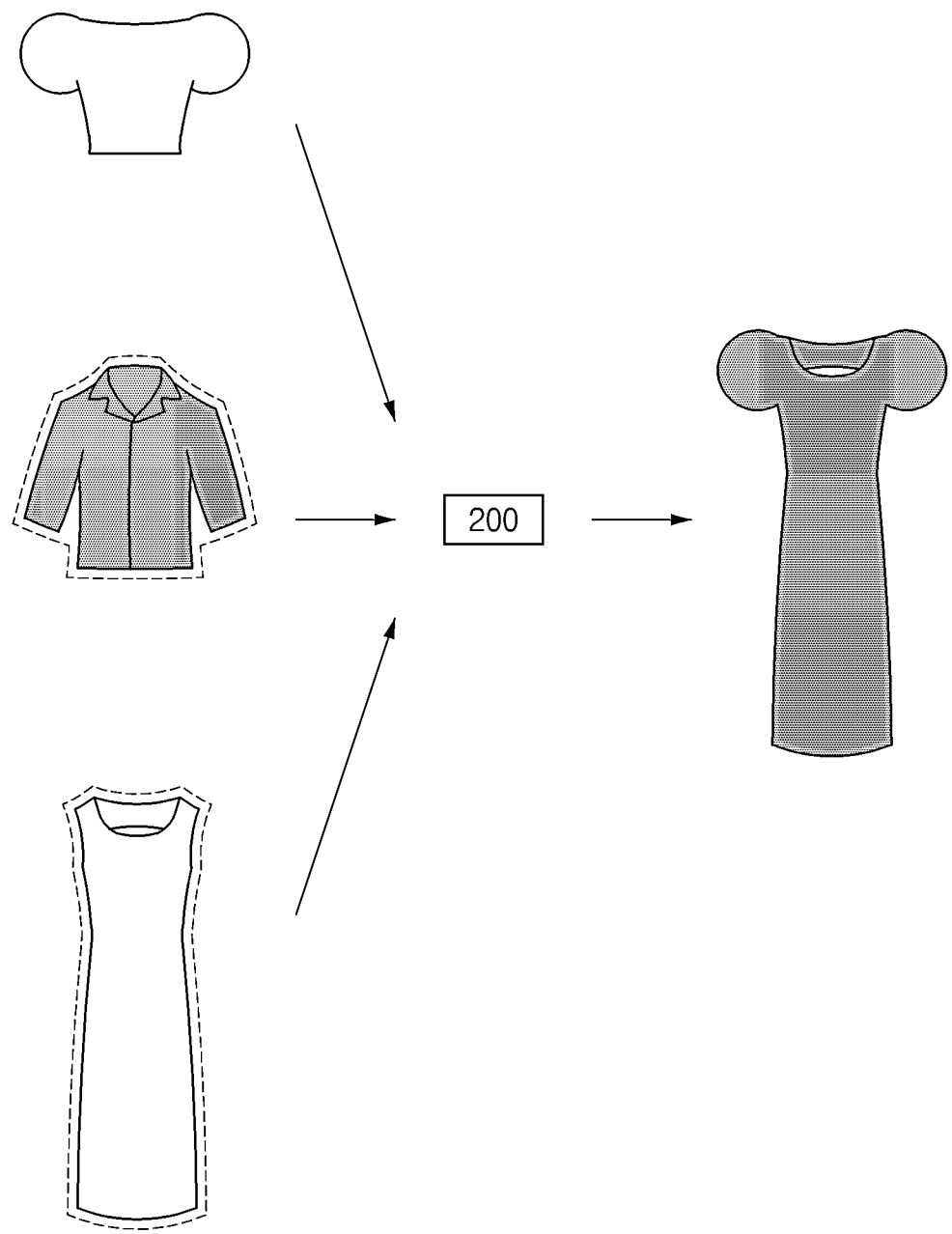
FIG. 6 is a view schematically showing a design generation process of synthesizing different elements and generating a new design according to an embodiment of the present disclosure.

In detail, referring to FIG. 6, among the trendy design elements, a knit "puff sleeve", a shirt "ultra violet", and a "long dress" are synthesized, so that designs with ultraviolet index long dresses with puff sleeves can be generated. It is also possible to synthesize different elements of the same item. For example, one blouse design can be generated by merging "cuff sleeves" of the blouse, "flower-shaped collar" of the blouse, and "mint color" of the blouse, which are the elements of the trendy design.

In addition, the design synthesis unit 404 may generate new design elements by synthesizing elements of a design extracted from an item and elements of a design extracted from an image that does not contain an item.

In addition, the design synthesis unit 404 may generate a new design for a specific item by synthesizing elements of a design extracted from an item and elements of a design extracted from an image that does not contain an item.

The evaluation unit 406 evaluates a newly generated design or design element in the design changing unit 402 or the design synthesis unit 404 on a constant basis. Specifically, the evaluation unit 406 may rank new designs or design elements extracted in consideration of various factors.

Ranking new designs or design elements may be determined based on the frequency of exposure of a specific design or design element on images exposed to social media or websites in general, the volume and amount of sales of items that contain a specific design or design element, and the preference (determined based on all data that can estimate the preference for the image, such as clicks, feedback, and sharing) for the corresponding image (including design or design elements similar to new designs or design elements) exposed on the Internet, such as a specific website or social media. In addition, when determining the frequency of exposure or when ranking, weights can be given to designs or design elements exposed from celebrities or famous person's social media or images, and if the preference, sales volume, or sales amount for a design or design element sold by a specific brand or website among elements of a high-level design is higher, weights can be given to the elements of the corresponding design (hereinafter, "weight determination"). The evaluation unit 406 can rank the new designs generated in such a way.

For example, if the generated design is a short cardigan of burgundy color, burgundy color may be variously expressed for each product. That is, burgundy colors but slightly different tones may be extracted. Therefore, for the selection of burgundy colors in various types of burgundy short cardigans, even the same burgundy color can extract a more preferred color to derive a short cardigan of the final burgundy color. Here, in order to extract the same burgundy color but more preferred color, it can be determined based on factors that can determine the preference between colors, such as whether the color is used by a specific brand having high preference or whether it is a color used in an image with high exposure.

Figure 10:
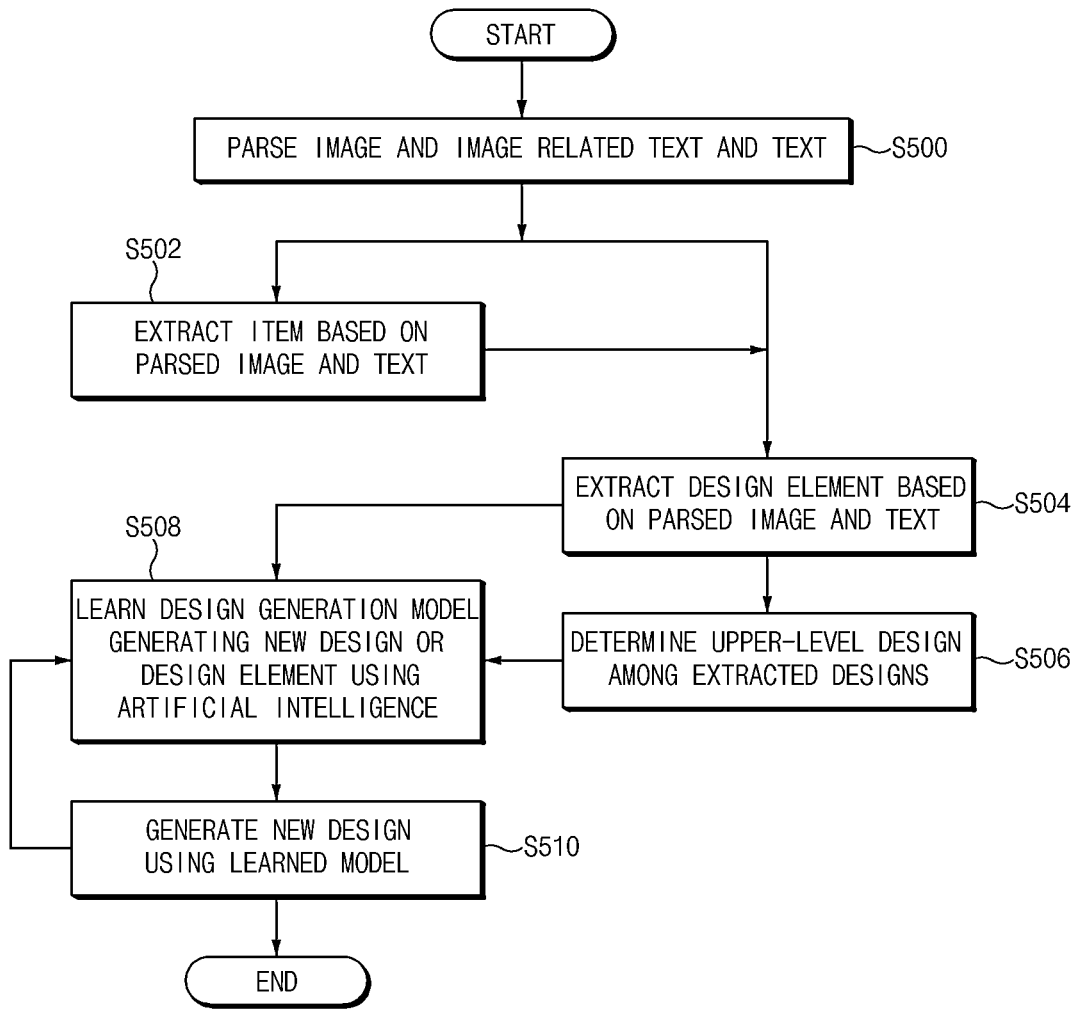
FIG. 10 is a flowchart of a method for generating a design by learning a design generation model according to an embodiment of the present disclosure.

FIG. 10 is a flowchart of a fashion design extraction method according to an embodiment of the present disclosure.

The parsing unit 202 parses an image exposed in real time from a received website, social media, or blog, text related to the image and text (S500). In addition, the parsing unit 202 parses the image, text related to the image, and text stored in the design generation device.

The item extraction unit 300 extracts an item based on the collected image and text (S502).

Specifically, the item extraction unit 300 extracts an item using parsed image and text data. In order to extract items, in addition to the parsed image and text data, a stored item extraction model is used. Here, items can include various items such as shoes, bags, dresses, ties, shirts, hats, cardigans, coats, and the like, and if there is a vector value recognized as a shirt in the image, a shirt item can be extracted by recognizing the 'shirt' part of the image. In addition, text related to the image may be used as a reference for extracting an item from the received image. Further, the item extraction unit 300 may extract a plurality of items from one image.

When an item is extracted from the item extraction unit 300, the design extraction unit 302 extracts an element of the design from the corresponding item (S504). In order to extract items, in addition to the parsed image and text data, an item extraction model (objection detection) is used. For example, items can include various items such as shoes, bags, dresses, ties, shirts, hats, cardigans, coats, and the like, and if there is a vector value corresponding to the shoe in the image, the shoe item can be extracted by recognizing the 'shoes' portion of the image.

Specifically, the design extraction unit 302 extracts the design elements of the extracted items (S504). Design element includes all the external elements that constitute the item, such as color, sleeve length, fit, pattern, and print. In addition, design elements may include materials, moods, and the like. Also, the design extraction unit 302 may extract design elements, for example, patterns, colors, shapes, and the like by using elements such as overall mood, shape, and color in the image from which the item is not extracted from the collected images in addition to the elements of the design for each item.

Subsequently, a high-level design among design or design elements extracted from the high-level design extraction unit 206 and the design extraction unit 302 is determined (S506).

Specifically, the fashionable design or design element can be determined based on the case where the frequency of exposure of a specific design or design element on an image exposed to social media or website is more than the reference value. In addition, it is possible to determine the upper-level design or design elements based on the sales volume and sales amount of items containing a specific design or design element on a specific website. Also, it is possible to determine the upper-level design or design elements based on preferences (determined based on all data that can estimate the preference for the image, such as the number of clicks, number of feedbacks, and number of shares) for the corresponding images exposed on the Internet, such as a specific website or social media. In addition, when determining whether a specific design or design element is a high-level design or design element, it is determined whether a famous person such as a celebrity wears it, so that these designs or design elements can be determined by weighting more.

Subsequently, a design generation model for generating a new design or design element using artificial intelligence is trained (S508).

Also, the learning unit 207 may generate and train a design generation model by reflecting image data and text data parsed using artificial intelligence, design elements/design elements for a specific extracted item, and a high-level design element among design elements for a specific item extracted from the design extraction unit. In addition, the learning unit 207 trains the design generation model by considering the generated design or design element for a specific item, and also evaluates the generated design or design element for a particular item to train the design generation unit by further considering the results.

Subsequently, a new design is generated using the learned design generation model (S510).

Specifically, the design generation unit 208 uses the following exemplary method to generate a new design or design element.

As an embodiment of generating a design, there is a method of generating a new design element by changing a vector value of the trendy design element. The change of the vector value can be inputted as a set value, and can be made by the learned design generation model. Specifically, for example, referring to FIG. 5, if a floral dress is fashionable, the vector values of the existing floral patterns in the floral dress extracted from the collected image can be changed to generate a new floral dress design.

Also, as another embodiment of generating a new design element, there is a method of synthesizing different elements among design elements to generate a new design for a specific item. Specifically, a new design can be generated by merging different elements among elements of each trendy design. For example, referring to FIG. 6, among the trendy design elements, a knit "puff sleeve", a shirt "ultra violet", and a "long dress" are synthesized, so that designs with ultra-violet index long dresses with puff sleeves can be generated. In addition, it may be automatically and randomly merged for these different elements, or may be merged according to the inputted set values (for design elements to be merged).

In addition, as another embodiment of generating a new design element, there is a method of generating a new design element by randomly changing and synthesizing the design elements.

For example, referring to FIG. 7, a pattern for a flower is extracted from a flower photo, and a glow color and mood are extracted from a photo with a sunset, such that a sunset pattern with a flower pattern may be generated.

In addition, the generated design or design element is reflected when the design generation model is trained again, so that the design generation model can be trained. And the newly learned design generation model can be used again when generating a new design or design element.

Although not shown in the drawing, the design generation unit ranks the generated design by evaluating the generated design. Specifically, the design generation unit 208 ranks new designs or design elements extracted in consideration of various factors.

Ranking new designs or design elements may be determined based on the frequency of exposure of a specific design on images exposed to social media or websites in general, the volume and amount of sales of items that contain a specific design, and the preference (all data that can estimate the preference for the image, such as clicks, feedback, and sharing) for the corresponding image exposed on the Internet, such as a specific website or social media. In addition, when determining the frequency of exposure or when ranking, weights can be given to designs or design elements exposed from celebrities or famous person's social media or images, and if the preference, sales volume, or sales amount for a design or design element sold by a specific brand or website among elements of a high-level design is higher, weights can be given to the elements of the corresponding design (hereinafter, "weight determination"). The design generation device 200 may rank the new design or design element generated in such a way. Also, in such a way, the design generation model can be trained using information ranked in a new design or a new design element.

Figure 11:
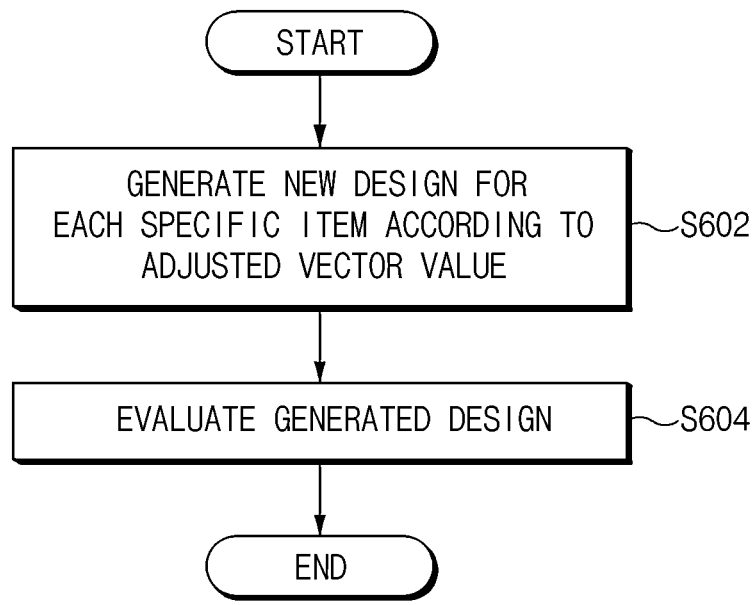
FIG. 11 is a schematic flowchart of a design change method according to an embodiment of the present disclosure.

FIG. 11 is a flowchart of a design change method according to an embodiment of the present disclosure.

Subsequently, the design changing unit 402 generates a new design or design element by changing the vector value of the design element using the learned design generation model (S602). The vector value may be changed by the set value received through the input unit, or may be changed automatically.

In addition, the generated design or design element is reflected when the design generation model is trained again, so that the design generation model can be trained. And the newly learned design generation model can be used again when generating a new design or design element.

The generated design or elements of the design are evaluated and ranked (S604).

Ranking new designs or design elements may be determined based on the frequency of exposure of a specific design or design elements on images exposed to social media or websites in general, the volume and amount of sales of items that contain a specific design, and the preference (all data that can estimate the preference for the image, such as clicks, feedback, and sharing) for the corresponding image exposed on the Internet, such as a specific website or social media. In addition, when determining the frequency of exposure or when ranking, weights can be given to designs or design elements exposed from celebrities or famous person's social media or images, and if the preference, sales volume, or sales amount for a design or design element sold by a specific brand or website among elements of a high-level design is higher, weights can be given to the elements of the corresponding design (hereinafter, "weight determination"). The design generation device 200 may rank the new design or design element generated in such a way. Also, in such a way, the design generation model can be trained using information ranked in a new design or a new design element.

Figure 12:
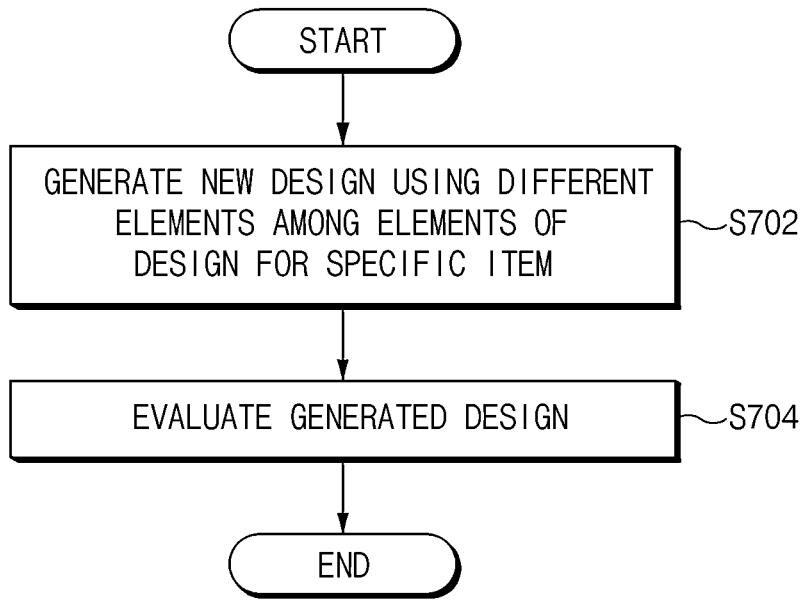
FIG. 12 is a schematic flowchart of a design synthesis method according to an embodiment of the present disclosure.

FIG. 12 is a flowchart of a design generation method according to an embodiment of the present disclosure.

The design synthesis unit 404 generates a new design using different elements among the elements of the trendy design for each collected item by using the design generation model (S702).

The generated new design may be limited to a design for a specific item. However, items with different elements extracted may be different items.

The generated design is reflected when the design generation model is trained again, so that the design generation model can be trained. And the newly learned design generation model can be used again when generating a new design or design element.

The generated design is evaluated and ranked (S704).

Ranking new designs may be determined based on the frequency of exposure of a specific design on images exposed to social media or websites in general, the volume and amount of sales of items that contain a specific design, and the preference (all data that can estimate the preference for the image, such as clicks, feedback, and sharing) for the corresponding image exposed on the Internet, such as a specific website or social media. In addition, when determining the frequency of exposure or when ranking, weights can be given to designs exposed from celebrities or famous person's social media or images, and if the preference, sales volume, or sales amount for a design element sold by a specific brand or website among the elements of the design included in the generated design, weights can be given to the elements of the corresponding design (hereinafter, "weight determination"). The design generation device 200 may rank the new design generated in such a way. Also, in such a way, the design generation model can be trained using information ranked in a new design.

Figure 13:
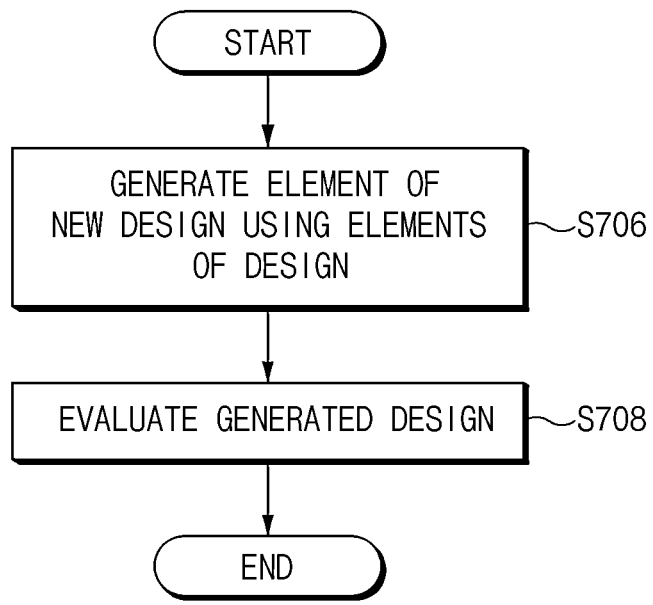
FIG. 13 is a schematic flowchart of design element generation according to an embodiment of the present disclosure.

FIG. 13 is a flowchart of a design generation method according to an embodiment of the present disclosure.

A new design element is generated using the design generation model (S706).

In addition to design elements for a specific item, a new design element is generated using a design element extracted based on an image from which the item is not extracted (S706). New design elements can include patterns, colors, and fits.

The generated design elements are evaluated and ranked (S708).

Ranking new design elements may be determined based on the frequency of exposure of a specific design on images exposed to social media or websites in general, the volume and amount of sales of items that contain a specific design element, and the preference (all data that can estimate the preference for the image, such as clicks, feedback, and sharing) for the corresponding image exposed on the Internet, such as a specific website or social media. In addition, when determining the frequency of exposure or when ranking, weights can be given to design elements exposed from celebrities or famous person's social media or images, and if the preference, sales volume, or sales amount for a design or design element sold by a specific brand or website among elements of the same design is higher, weights can be given to the elements of the corresponding design (hereinafter, "weight determination"). The design generation device 200 may rank the new design or design element generated in such a way. Also, in such a way, the design generation model can be trained using information ranked in a new design or a new design element.

Figure 14:
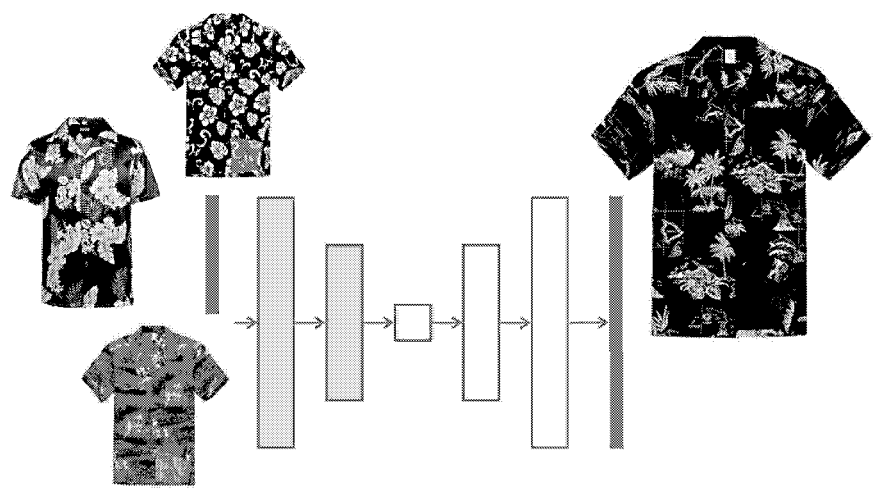
FIG. 14 is an example of use of a design generation method according to an embodiment of the present disclosure.

Referring to FIG. 14, a new design generated through the design changing unit 402 is illustrated. When a shirt with various prints is fashionable, a shirt with a new print is designed by changing an existing print element.

Figure 15:
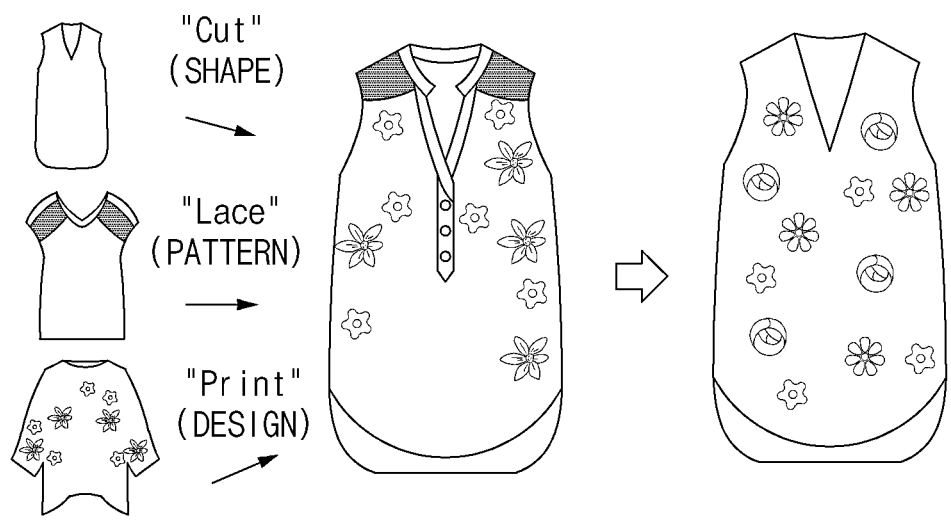
FIG. 15 is an example of the use of a design synthesis method according to an embodiment of the present disclosure.

Referring to FIG. 15, an example in which a new design is generated by combining different design elements is illustrated.

Figure 16:
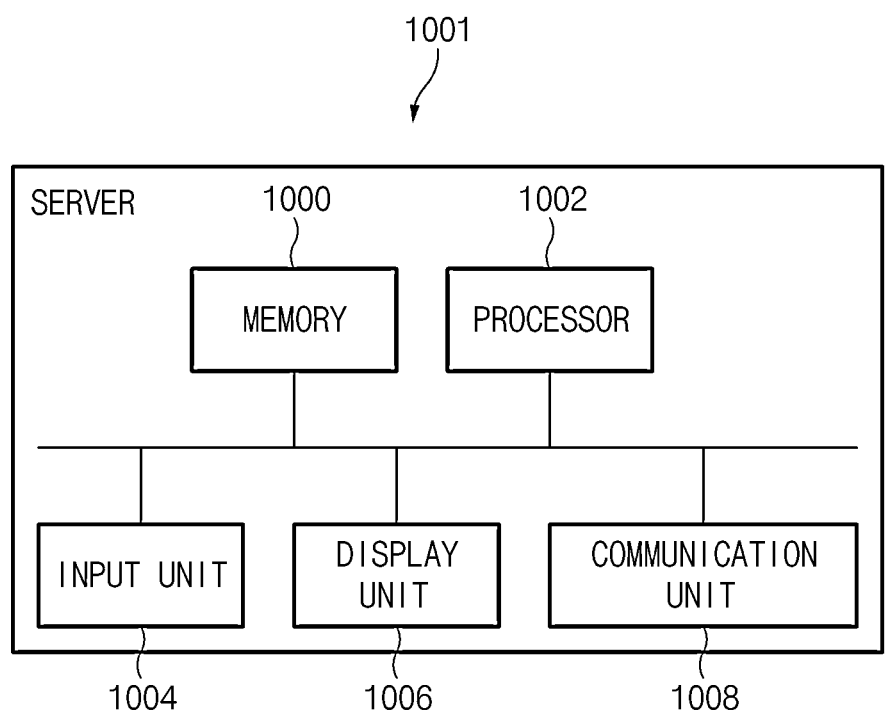
FIG. 16 is a diagram showing a configuration of hardware in which a program for executing a method according to an embodiment of the present disclosure is stored.

FIG. 16 is a diagram showing a configuration of hardware in which a program for executing a method according to an embodiment of the present disclosure is stored.

A server 1001 corresponds to a design generation device according to an embodiment of the present disclosure.

The server 1001 includes a memory 1000, a processor 1002, an input unit 1004, a display unit 1006, and a communication unit 1008.

The memory 1000 corresponds to the storage unit 204 and stores an item extraction model. The item extraction model may determine which item corresponds to a vector value in the corresponding image.

Also, the memory 1000 categorizes and stores the extracted item. In addition, the memory 1000 categorizes and stores design elements for each item extracted from the fashionable design extraction unit 206. Also, the memory 1000 may store a model ranking the generated new designs.

The processor 1002 generates a new design using the collected images and text. It corresponds to the extraction unit 203 and the design generation unit 208 of the design generation device.

The processor 1002 extracts an item using an image and text using an item extraction model stored in the memory 1000 and using the collected image and text, and then extracts a design or design element for each item. Alternatively, the processor 1002 may extract the design and design elements using images and text from which the item is not extracted, even if the item is not extracted.

Also, the processor 1002 extracts a high-level design or a high-level design element from the extracted design or design element. Specifically, the upper-level design or design element can be determined based on the case where the frequency of exposure of a specific design or design element on an image exposed to social media or website is more than the reference value. In addition, it is possible to determine the upper-level design or design elements based on the sales volume and sales amount of items containing a specific design or design element on a specific website. Also, it is possible to determine the upper-level design or design elements based on preferences (determined based on all data that can estimate the preference for the image, such as the number of clicks, number of feedbacks, and number of shares) for the corresponding images exposed on the Internet, such as a specific website or social media. In addition, when determining whether a specific design or design element is a high-level design or design element, it is determined whether a famous person such as a celebrity wears it, so that these designs can be determined by weighting more.

Also, the processor 1002 trains a design generation model.

Also, the processor 1002 may generate and train a design generation model by reflecting image data and text data parsed using artificial intelligence, design elements/design elements for a specific extracted item, and a high-level design element among design elements for a specific item extracted from the design extraction unit.

In addition, the processor 1002 trains the design generation model by considering the generated design or design element for a specific item, and also evaluates the generated design or design element for a particular item to train the design generation unit by further considering the results.

Subsequently, the processor 1002 generates a new design using high-level designs and a design generation model.

As an embodiment of generating a design, there is a method of generating a new design element by changing a vector value of the trendy design element. The change of the vector value can be inputted as a set value, and can be made by the learned design generation model. Specifically, for example, referring to FIG. 5, if a floral dress is fashionable, the vector values of the existing floral patterns in the floral dress extracted from the collected image can be changed to generate a new floral dress design.

Also, as another embodiment of generating a new design element, there is a method of synthesizing different elements among design elements to generate a new design for a specific item. Specifically, a new design can be generated by merging different elements among elements of each trendy design. For example, referring to FIG. 6, among the trendy design elements, a knit "puff sleeve", a shirt "ultra violet", and a "long dress" are synthesized, so that designs with ultra-violet index long dresses with puff sleeves can be generated. In addition, it may be automatically and randomly merged for these different elements, or may be merged according to the inputted set values (for design elements to be merged).

In addition, as another embodiment of generating a new design element, there is a method of generating a new design element by randomly changing and synthesizing the design elements.

In addition, the processor 1002 evaluates and ranks the generated design or design element. Ranking new designs may be determined based on the frequency of exposure of a specific design or design element on images exposed to social media or websites in general, the volume and amount of sales of items that contain a specific design, and the preference (determined based on all data that can estimate the preference for the image, such as clicks, feedback, and sharing) for the corresponding image exposed on the Internet, such as a specific website or social media. In addition, when determining the frequency of exposure or when ranking, weights can be given to designs or design elements exposed from celebrities or famous person's social media or images, and if the preference, sales volume, or sales amount for a design or design element sold by a specific brand or website among elements of a design is higher, weights can be given to the elements of the corresponding design (hereinafter, "weight determination"). The design generation device 200 ranks the new design or design element generated in this way and derives only a design having a predetermined rank or more as a final result design.

The ranking results are reflected when training the design generation model.

The display unit 1006 may display the generated design.

When the communication unit 1008 is to receive image data or text data, or to manufacture the generated design, it may transmit the design and manufacturing quantity to be manufactured to the factory.

In addition, the device or system according to various embodiments may include at least one or more of the above-described components, some of them may be omitted, or additional other components may be further included. Moreover, the embodiments disclosed in this specification are suggested for the description and understanding of technical content but do not limit the range of the present disclosure. Accordingly, the range of the present disclosure should be interpreted as including all modifications or various other embodiments based on the technical idea of the present disclosure.

What is claimed is:

1. A design generation device comprising:
   a parsing unit configured to parse image data and text data in real time online;
   a learning unit configured to train a design generation model using artificial intelligence based on the parsed image data and text data;
   a design generation unit configured to generate a new design or a design element of a specific item by using the design generation model trained in the learning unit based on the real time parsed image data and text data, without separate input from a user,
   wherein the learning unit and the design generation unit are configured to perform the training of the design generation model, and the generation of the design or the design element using at least one of generative adversarial network (GAN), variational autoencoder (VAE)+GAN, genetic algorithm (GA)+GAN, conditional GAN, and style transfer, and
   wherein the design generation unit further comprises a design changing unit configured to generate the new design or the design element of the specific item by reflecting a received vector value as an input;
   a processor; and
   a memory.

2. The design generation device of claim 1, wherein the design generation unit further comprises a design synthesis unit configured to generate a new design in real time using the trained design generation model learned in real time.

3. The design generation device of claim 1, wherein further comprising an evaluation unit configured to evaluate the generated new design or the design element of the specific item based on a frequency of being exposed to at least one of website, blog, and social media, a sales volume, a preference, and a preset weight.

4. The design generation device of claim 3, wherein an evaluation result of the evaluation unit is reflected when the design generation model is trained in the learning unit.

5. The design generation device of claim 1, wherein the design generation unit generates the design or the design element of the specific item based on image and text data that does not include the design or the design element of the specific item.

* * * * *